United States Patent [19]

Schaedeli et al.

[11] Patent Number: 6,042,989
[45] Date of Patent: Mar. 28, 2000

[54] RADIATION SENSITIVE COMPOSITIONS OF TERPOLYMERS CONTAINING ORGANOSILICON SIDE CHAINS

[75] Inventors: Ulrich Schaedeli, Plasselb; Eric Tinguely, Fribourg; Manfred Hofmann, Marly; Pasquale Alfred Falcigno, Basel, all of Switzerland; Carl-Lorenz Mertesdorf, Bad Krozingen, Germany

[73] Assignee: Olin Microelectronic Chemicals, Inc., Norwalk, Conn.

[21] Appl. No.: 09/178,827

[22] Filed: Oct. 26, 1998

Related U.S. Application Data

[62] Division of application No. 08/682,171, Jul. 16, 1996, Pat. No. 5,886,119.

[30] Foreign Application Priority Data

Aug. 8, 1995 [CH] Switzerland .......................... 2292/95

[51] Int. Cl.⁷ ..................................................... G03C 1/72
[52] U.S. Cl. ...................... 430/270.1; 526/266; 526/270; 526/279
[58] Field of Search ........................ 430/270.1; 526/266, 526/270, 279

[56] References Cited

U.S. PATENT DOCUMENTS

| 4,481,049 | 11/1984 | Reichmanis et al. ................. 156/643 |
| 5,102,771 | 4/1992 | Vogel et al. ........................... 430/270 |
| 5,369,200 | 11/1994 | Schaedeli et al. .................... 526/262 |
| 5,552,260 | 9/1996 | Vogel et al. ....................... 430/270.1 |
| 5,886,119 | 3/1999 | Schaedeli et al. .................... 526/266 |

FOREIGN PATENT DOCUMENTS

WO 94/11788  5/1994  WIPO ............................. G03F 7/075

*Primary Examiner*—Bernard Lipman
*Assistant Examiner*—Kelechi Egwim
*Attorney, Agent, or Firm*—Ohlandt, Greeley, Ruggiero & Perle

[57] ABSTRACT

A radiation sensitive composition comprising (a) a terpolymer containing 20 to 70 mole percent of an acid-labile repeating unit, 3 to 40 mole percent of an acrylic or acrylonitrile based repeating unit and a repeating unit containing silicon side-chains and (b) a photo-acid generator. The silicon content of terpolymer is 7 to 20 weight percent. The composition is used primarily in the formulation of multilayer positive operating photoresists.

9 Claims, No Drawings

RADIATION SENSITIVE COMPOSITIONS OF TERPOLYMERS CONTAINING ORGANOSILICON SIDE CHAINS

This is division of application Ser. No. 08/682,171 filed Jul. 16, 1996, now U.S. Pat. No. 5,886,119.

BACKGROUND OF THE INVENTION

1. Field of the Invention

The present invention concerns a new terpolymer with silicon-containing side chains, a radiation-sensitive composition based on this terpolymer, as well as two processes for the lithographic treatment of a substrate by means of these compositions and corresponding processes for the production of an object, particularly an electronics component.

2. Brief Description of Relevant Art

In recent years, the extent of integration of semiconductor components has been continually increasing. The resolution capacity that can be obtained with conventional deep-UV microlithography has thus reached its limits. Normally, it is no longer possible to produce, on a substrate, conventional structures with dimensions of less than 0.25 $\mu$m, as is required for the production of particularly highly integrated electronics components that have been targeted recently; these have minimal dimensions down to approximately 0.12 $\mu$m. In order to be able to resolve sufficiently, in an optical manner, such fine structural elements, particularly shortwave radiation must be utilized, which generally has a wavelength between 190 and 260 nm.

Today's conventional deep-UV photoresistant materials, however, are poorly suitable for such radiation. These materials are usually based on phenolic resins as binders, for example, on novolak resins or on polyhydroxystyrene derivatives, which show a strong absorption at wavelengths below 260 nm, due to their aromatic structural elements. However, this leads to the fact that, with the use of such radiation, the side walls of the finished developed resist structures do not form the targeted right angle, but rather form a more or less oblique angle with the substrate or the resist surface, which nullifies the obtaining of optical resolution as a consequence of the use of shortwave radiation.

Photoresists without a sufficiently high proportion of aromatic components, e.g., resists based on methacrylate resins, have proven sufficiently transparent for radiation below 260 nm, but they do not have the stability in plasma etching that is customary for resists based on phenolic resins; plasma etching is a principal method for producing microstructures on silicon substrates. The plasma etching stability, as is known, is essentially based on the aromatic groups in these resists.

There have also been various solutions proposed for this problem. One solution is offered by the use of a special multilayer technique. First, an initial resin coating, commonly called a planarizing layer, is introduced onto the substrate, and this layer must not be photostructurable. A second coating, a covering layer that can be photostructured, which contains an organosilicon component instead of a component with a high content of aromatic compounds, is introduced onto this first layer. The substrate coated in this way is selectively exposed, i.e., in an image-forming way, in the conventional manner and then treated with a suitable developer, so that a desired image-forming structure is generated in the covering coating that can be photostructured. A subsequently conducted treatment in oxygen plasma leads to the fact that the organosilicon compounds contained in it are oxidized to silicon oxides, at least on the surface, and these oxides form a closed etching barrier for the oxidative decomposition of the organic material that lies underneath, particularly the planarizing layer, while the planarizing layer is removed completely in an oxidative manner on those places that are not coated by the silicon-containing covering layer.

Various compositions that can be photostructured and contain organosilicon components, which are suitable for the above-given lithographic process, are described, for example, in WO-A-94/11,788. In one type, this involves a composition based on a substance that forms acid under the effect of actinic radiation (in the following, such compounds will also be called photo acid generators) and a copolymer as binder. The copolymer comprises repeating structural units with atom groups that cleave under the catalytic effect of acid, and in this way can bestow solubility to the binder in aqueous-alkaline developers, and is also comprised of repeating structural units that contain organosilicon side chains. A typical corresponding copolyer has the following structure:

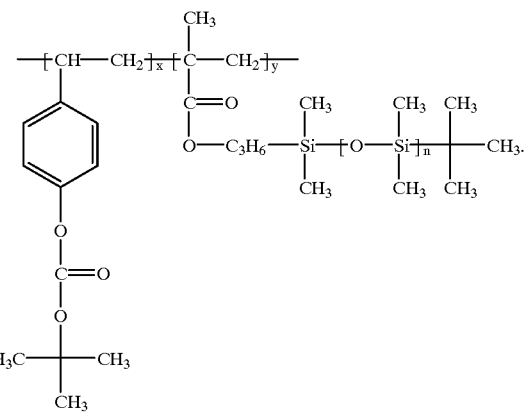

Compositions such as these, however, are still capable of improvement. For example, their heat form stability is still insufficient for certain requirements, because a softening might occur during treatment in oxygen plasma and as a consequence, the covering layer may soften and flow, which can lead to an imprecise formation of the etching barrier and consequently to an imprecise transfer of the desired structure onto the substrate. Further, the named polymers also very strongly absorb radiation of 193 nm wavelength, due to their content of aromatic compounds.

BRIEF SUMMARY OF THE INVENTION

The present invention has the task of making available a positively operating, chemically reinforced photoresist containing organosilicon components, particularly for use for multilayer techniques, and this photoresist will be characterized by improved heat form stability and a higher $T_g$ value (higher glass transition point). It has been shown that this can be achieved by the use of a specific organosilicon terpolymer as the binder for the etching resist.

The subject of the present invention is thus a terpolymer containing 20 to 70 mole percent of repeating structural units of formula (I) and 3 to 40 mole percent of repeating structural units of formula (II):

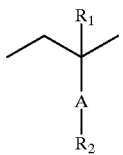
(I)

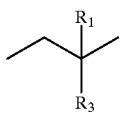
(II)

as well as repeating structural units of formula (III):

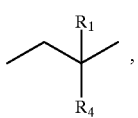
(III)

whereby

A indicates a direct single bond or a group of the formula:

$R_1$ indicates a hydrogen atom or a methyl group,
$R_2$ indicates a 2-furanyloxy or 2-pyranyloxy group or a group of the formula:

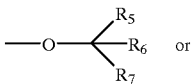

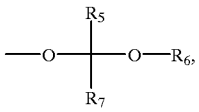

$R_3$ indicates a group of the formulas:

—COOH or —CN, $R_4$ indicates a group selected from the groups of formulas:

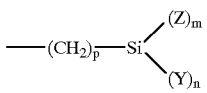

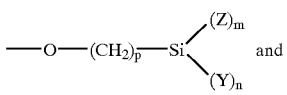
and

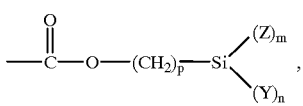

$R_5$ indicates a $C_1$–$C_6$ alkyl group or a phenyl group,
$R_6$ indicates a $C_1$–$C_6$ alkyl group or a phenyl group,
$R_7$ indicates a $C_1$–$C_6$ alkyl group or a phenyl group,
Y indicates a hydrogen atom or a chlorine atom or a methyl group,
Z indicates a group of the formula —OSi(CH$_3$)$_3$,
m indicates 1, 2 or 3,
n indicates 3 minus m, and
p indicates 0, 1, 2 or 3 and whereby as many structural units of formula (III) are contained in the terpolymer such that its silicon contents amounts to 7 to 20 weight percent.

DETAILED DESCRIPTION OF PREFERRED EMBODIMENTS

The molecular weight (weight average $M_w$) of the terpolymers of the invention appropriately lies between 5,000 and 200,000 and preferably between 8,000 and 50,000.

If residue $R_2$ corresponds to a 2-furanyloxy or a 2-pyranyloxy group, then these are preferably unsubstituted. They may, however, also be substituted, particularly by one or more $C_1$–$C_4$ alkyl groups or $C_1$–$C_4$ alkoxy groups.

The residue $R_1$ preferably corresponds to a methyl group.

The residue $R_2$ preferably corresponds to a group of formulas:

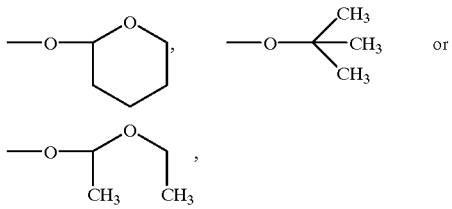

especially to the group

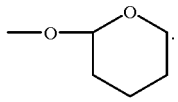

Preferably, residue $R_3$ indicates —COOH.

$R_5$, $R_6$ and $R_7$ indicate $C_1$–$C_6$ alkyls, e.g., methyl, ethyl, n-propyl, i-propyl, butyl residues, pentyl or hexyl residues.

Further, terpolymers are preferred according to the invention, in which p amounts to 1, 2, or most preferably to 3.

Preferably, the terpolymers of the invention contain 3 to 35 mole percent of repeating structural units of formula (II). Thus, they may have, for example, 3 to 35 mole percent of repeating structural units of formula (II), and
15 to 30 mole percent of repeating structural units of formula (III), whereby repeating structural units of formula (I) form the balance to 100 mole percent and make up for example, 50 to 70 mole percent.

Most particularly preferred are terpolymers of the invention, in which $R_2$ corresponds to a group of formula

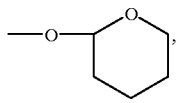

R₃ corresponds to a group of formula

—COOH and

R₄ corresponds to a group of formula

—(CH₂)₃—Si[OSi(CH₃)₃]₃, particularly if these termpolyers 3 to 31 mole percent repeating structural units of formula (II), 10 to 30 mole percent of repeating structural units of formula (III), whereby repeating structural units of formula (I) form the balance to 100 mole percent.

The terpolymers of the invention may be produced from the corresponding (meth)acrylate and/or vinyl ether monomers with the application of conventional thermal or even radiation-induced polymerization methods known to the expert. Conventional polymerization methods are, for example, mass polymerization or solvent polymerization or also emulsion, suspension or precipitation polymerization.

The terpolymers of the invention represent a valuable formulation component for radiation-sensitive compositions, as for chemically reinforced positive-operating photoresist compositions. The invention thus also has as a subject a radiation-sensitive composition that contains the above-described terpolymers as well as a substance, which forms acid under the effect of actinic radiation of a wavelength below 300 nm and preferably below 260 nm. The radiation-sensitive composition of the invention appropriately contains 80 to 99.9, preferably 90 to 99.5 weight percent of the terpolymer of the invention, as well as 0.1–20, preferably 0.5–10 weight percent of the photo acid generator, whereby the latter data refer to the total amount of these two components in the composition.

All known compounds can be used as the photo acid generator, as long as they form acid under the effect of actinic radiation of a wavelength below 300 nm. A large number of such compounds is named, e.g., in EP-A-0 601,974 (=U.S. Pat. No. 5,369,200), whose description will also be a component of this description. Preferred radiation-sensitive acid donors are onium salts, such as diazonium, sulfonium, sulfoxonium, and iodonium salts, as well as disulfones.

Preferably preferred are sulsonium salts of the formula:

$(Ar_1)_q(Z_1)_r(Z_2)_sS^+X_1^-$ in which

Ar₁ is unsubstituted phenyl, naphthyl, or phenyl-COCH₂— or these compounds substituted by halogen, C₁–C₄ alkyl, C₁–C₄ alkoxy, —OH and/or nitro-substituted, Z₁ is C₁–C₆ alkyl or C₃–C₇ cycloalkyl, and Z₂ is tetrahydrothienyl, tetrahydrofuryl or hexahydropyryl, q stands for 0, 1, 2 or 3 r stands for 0, 1 or 2, and s stands for 0 or 1, whereby the sum of q+r+s amounts to 3, and $X_1^-$ is a chloride, bromide, or iodide anion, $BF_4^-$, $PF_6^-$, $AsF_6^-$, $SbF_6^-$ or the anion of an organic sulfonic acid or carboxylic acid.

Phenyl, naphthyl and phenacyl Arl groups may also be multiply substituted, or preferably singly substituted, for example, by Cl, Br, methyl, methoxy, —OH or nitro. Particularly preferred, these residues are unsubstituted. Z₁ is preferably C₁–C₄ alkyl, especially methyl or ethyl. Preferably, q is 2 or 3, r is 1 or zero and s is zero, and particularly, q is the number 3 and r and s are zero. Most particularly preferred, Ar₁ is unsubstituted phenyl and q is 3.

If $X_1^-$ represents the anion of an organic sulfonic acid or carboxylic acid, then it may involve anions of aliphatic, cycloaliphatic, carbocyclic-aromatic, heterocyclic-aromatic or araliphatic sulfonic or carboxylic acids. These anions may be substituted or unsubstituted. Sulfonic and carboxylic acids with small nulceophilia are preferred, for example, partially fluorinated or perfluorinated derivatives or derivatives substituted in the neighboring position to the respective acid group. Examples of substituents are halogens, such as chlorine, and particularly fluorine, alkyl, such as methyl, ethyl or n-propyl, or alkoxy, such as methoxy, ethoxy or n-propoxy.

Preferably $X_1^-$ is the monovalent anion of an organic sulfonic acid, particularly a partially fluorinated or perfluorinated sulfonic acid. These anions are characterized by a particularly small nucleophilia.

Special examples of suitable sulfonium salts are triphenyl sulfonium bromide, triphenyl sulfonium chloride, triphenyl sulfonium iodide, triphenyl sulfonium hexafluorophosphate, triphenyl sulfonium hexafluoroantimonate, triphenyl sulfonium hexa-fluoroarsenate, triphenyl sulfonium trifluoromethane sulfonate, diphenylethyl sulfonium chloride, phenacyldimethyl sulfonium chloride, phenacyltetrahydrothiophenium chloride, 4-nitrophenacyltetrahydrothiophenium chloride, and 4-hydroxy-2-methylphenylhexahydrothiopyrylium chloride. Particularly preferred is triphenyl sulfonium trifluoromethane sulfonate (triphenyl sulfonium triflate).

Particularly preferred, sulfonium compounds of the above formula are used, in which Ar₁ indicates phenyl, q is the number 3, r and s are zero, and $X_1^-$ represents $SbF_6^-$, $AsF_6^-$, $PF_6^-$, $CF_3SO_3^-$, $C_2F_5SO_3^-$, n—$C_3F_7SO_3^-$, n—$C_4F_9SO_3^-$, n—$C_6F_{13}SO_3^-$, n—$C_8F_{17}SO_3^-$, $C_6F_5SO_3^-$.

The photoresists of the invention may also contain suitable conventional additives in conventional quantities, e.g., of an additional 0.01 to 40 weight percent, with respect to the total quantity of terpolymer and photo acid generator, such as, e.g., basic additives (lacquer additives), for example 2-methylimidazole, triisopropylamine, 4-dimethylaminopyridine or 4,4'-diaminodiphenyl ether, or also stabilizers, pigments, colorants, fillers, bonding agents, leveling agents, wetting agents and softeners.

Preferably, the photoresist compositions are dissolved in a suitable solvent for the application. The selection of the solvent and the concentration are primarily directed according to the type of composition and according to the coating process. The solvent will be inert, i.e., it will not enter into any chemical reaction with the components and it can be removed again after coating during drying. Suitable solvents are, e.g., ketones, ethers and esters, such as methyl ethyl ketone, 2-heptonone, cyclopentanone, cyclohexanone, γ-butyrolactone, ethyl pyruvate, diethylene glycol dimethyl ether, 2-methoxyethanol, 2-ethoxy ethanol, 2-ethoxyethyl acetate, 1-methoxy-2-propyl acetate, 1,2-dimethoxyethane, acetic acid ethyl ester, and 3-methoxymethyl propionate, or mixture of these solvents.

The resist formulations according to the invention (radiation-sensitive compositions) may be produced, for example, by mixing of the individual components with stirring, whereby a homogeneous solution is obtained.

The compositions of the invention are suitable as positive photoresists, whereby both a single layer as well as a multilayer technique can be applied. In this application, a positive photoresist is understood to be a composition, which dissolves better in an aqueous-alkaline solution after radiation, and a subsequent heat treatment, if needed.

The invention thus also has as a subject a process for the lithographic treatment of a substrate by means of a multilayer technique, in which the substrate:

a1) is provided with a first coating of a film-forming organic material, b1) a second coating containing a terpolymer of the invention and a substance that forms acid under the effect of actinic radiation of a wavelength below 260 nm, is introduced on this first coating, c1) the thus-coated substrate is irradiated in an image-forming way with with radiation of a wavelength of 248 to 254 or of 193 nm, to which the photo acid generator is sensitive, d1) is subjected to a heat treatment, e1) is treated with an aqueous alkaline developer solution, until the irradiated regions of the second coating are removed, and f1) after this is treated with an oxygen-containing plasma until the first coating is completely removed on those places where it is not covered by the second coating.

In addition, the invention has as a subject a process for the lighographic treatment of a substrate by means of a single-layer technique, in which on the substrate a2) is introduced a coating, containing a terpolymer of the invention and a photoinitiator, which forms acid under the effect of actinic radiation of a wavelength below 260 nm, b2) the thus-coated substrate is irradiated in an image-forming way with radiation to which the photoinitiator is sensitive, particularly with radiation of a wavelength of 248 to 254 nm or of 193 nm, c2) is subjected to a heat treatment, and d2) is treated with an aqueous alkaline developer solution until the irradiated regions of the second coating are removed.

Practically all film-forming organic polymers can be used as the film-forming organic material for the first coating (planarizing layer) with the use of the multilayer technique. Particularly preferred are phenolic resins, particularly novolak resins, such as formaldehyde cresol or formaldehyde phenol novolaks, as well as polyimide resins, and poly(meth)acrylate resins. The planarizing layer is generally 0.5 to 1 μm thick. The resin is first dissolved in a suitable solvent and then introduced by the usual coating processes onto the substrate, e.g., by dipping, blade coating, painting, spraying, particularly by electrostatic spraying, and reverse-role coating, and above all by spinning.

After the first layer is dried, the second coating, containing a terpolymer of the invention, a substance that forms acid under the effect of actinic radiation of a wavelength below 300 nm, preferably below 260 nm, as well as other additives, if needed, is introduced onto the first coating. The second coating may also be realized with any conventional coating process, for example, one of those named above, but here also spin coating is particularly preferred. The covering layer is appropriately approximately 0.2 to 0.5 μm thick.

For the production of relief structures, the thus-coated substrate is then selectively exposed, i.e., to form the image. Exposure is preferably produced with actinic radiation of a wavelength of 190–300 nm, particularly of 190 to 260 nm. All known sources of the respective radiation can be utilized in principle for irradiation, for example, mercury high-pressure lamps, but particularly excimer lasers, such as the krypton fluoride laser with radiation of 248-nm wavelength or the argon fluoride excimer laser with 193-nm radiation. The image-forming irradiation is produced either by means of a mask, preferably a chromium-quartz mask, or—when laser exposure devices are used—also by moving the laser beam in a computer-controlled manner over the surface of the coated substrate and thus the image is produced. Here, the high sensitivity of the photoresist materials of the invention is very advantageously noticeable in that it permits high writing speeds at relatively low intensities. The high sensitivity of the resist is also of advantage for exposure by means of steppers, where very short exposure times are desired.

The process of the invention also encompasses, between selective irradiation and treatment with a developer, a heating of the coating as a further process measure. By means of this heat treatment, the so-called "post-exposure bake", a practically complete reaction of the resist material, is obtained in an especially rapid time. The time and temperature of this post-exposure bake may vary within broad regions and essentially depend on the composition of the resist, particularly by the type of its acid-sensitive components, and the type of radiation-sensitive acid donor used, as well as the concentrations of these two components. Commonly, the exposed resist is subjected to several seconds up to several minutes of temperatures of approximately 50–150° C.

After the image-forming exposure and heat treatment of the material conducted as needed, the irradiated spots of the covering coating that are better soluble in aqueous alkaline as a consequence are dissolved out with an aqueous-alkaline developer, i.e., with an aqueous solution of bases to which small quantities of organic solvents or their mixtures may also be added as needed.

Particularly preferred as developers are aqueous alkaline solution, as they are also utilized for the development of conventional novolak naphthoquinone diazide positive resist coatings. These include, e.g., aqueous solutions of alkali metal silicates, phosphates, hydroxides, and carbonates, but particularly tetraalkylammonium hydroxide solutions, such as e.g., tetramethylammonium hydroxide solution, which is free of metal ions. Still smaller quantities of wetting agents and/or organic solvents may also be added to these solutions. Typical organic solvents, which may be added to the developer fluids, are, for example, cyclohexanone, 2-ethoxyethanol, toluene, acetone, isopropanol or ethanol, as well as mixtures of two of more of these solvents.

After this, the thus-treated workpiece is treated with an oxygen plasma, whereby a closed silicon oxide layer is formed within several seconds, at least in the uppermost regions of the covering coating of organosilicon components in the covering layer, and this silicon oxide layer protects the regions of the organic material lying underneath against an attack of oxygen plasma. Treatment with the oxygen plasma is continued until the substrate is completely free in those places where the covering coating has been removed beforehand by means of the developer. In general, an etching time of 5 to 15 minutes is sufficient for this purpose.

The substrate can finally be subjected to a conventional structuring treatment, e.g., a dry etching in halogen, $CF_4$, or oxygen plasma on those places free of the coating. After this, the entire protective coating is removed from the substrate, e.g., by dissolving with a suitable solvent, after which the depicted process cycle is repeated, if needed, in order to produce further structures on the substrate. Therefore, a process for the production of an object, particularly an electronic component, comprising the above-depicted process for the lithographic treatment of a substrate forms another subject of the invention.

The present invention is further illustrated by the following Examples. All parts and percentages are by weight and all temperatures are degrees Celsius unless explicitly stated otherwise.

EXAMPLES

Example 1

Production of a terpolymer of methacrylic acid tetrahydro-2H-pyranyl ester, methacrylic acid, and methacryloxypropyl-tris(trimethylsiloxy) silane.

A solution of 6.38 g (37.5 mmoles) of methacrylic acid tetrahydro-2H-pyranyl ester, 6.33 g (15 mmoles) of methacryloxypropyl-tris(trimethylsiloxy) silane, 1.95 g (23 mmoles) of methacrylic acid, 0.16 g of azobisisobutyronitrile and 0.1 g of 1-dodecanethiol in 105 ml of tetrahydrofuran are stirred for 20 seconds under a nitrogen atmosphere at a temperature of 75° C. in a 250-ml round-bottomed flask with a magnetic stirrer. After cooling, the reaction solution is precipitated by addition of one liter of water. The formed precipitate is filtered and dried in high vacuum ($4\times10^{-6}$ bars), whereby 11.7 g (78% of the theoretical) of a white powder are obtained.

GPC (polstyrene standard): $M_w$=11,950; $M_n$=4,250; $M_w/M_n$=2.8.

TGA (heating rate of 10° C./min.): weight loss of 24.1% between 110 and 200° C.

UV Absorption of a 0.45 µm thick film, produced, as described below, at 193 nm: 0.17.

Example 2

A resist solution is prepared by dissolving 0.985 g of the terpolymer of Example 1, 10 mg of triphenyl sulfonium triflate, and 0.5 mg of dimethylaminopyridine in 5 ml of 1-methoxy-2-propyl acetate. This solution is spun at 4,000 rpm onto a 3-inch silicon wafer. After the subsequent 1-minute drying at 100° C., a film results with a layer thickness of 0.5 µm. This film is exposed by means of a mercury vapor lamp of the type Ushio UXM-502 MD through a narrow-band interference filter and a chromium quartz mask with a radiation of 254 nm (dose of 20 mJ/cm²). Then the wafer is heated to 120° C. for one minute on a hot plate and then developed in a 0.131 N solution of tetramethylammonium hydroxide in water, whereby the previously exposed zones of the resist film go into solution and those that are not exposed remain on the substrate.

Example 3

The resist solution of Example 2 is spun at 6,000 rpm onto a 4-inch silicon wafer, which has already been coated with an 0.9 µm thick layer of a novolak film (produced by spinning a solution of a novolak with a 28 mole percent cresol component (Novolak® P28 of OCG Microelectronic Materials, Inc. (OCG) of Norwalk, Conn., U.S.A.) in cyclopentanone and subsequent 30-minute heating to 250° C.). After heating on the hot plate (1 minute; 100° C.), a 0.25-µm thick covering film results. The wafer coated in this way is now exposed to form an image with a Canon FPA 4500 illumination device through a mask with radiation of a wavelength of 248 nm and then is again heated for one minute on a hot plate to a temperature of 100° C. After this, it is first developed with a 0.131 N solution of tetramethylammonium hydroxide in water, whereby the mask structures are imaged in the covering layer as the relief. Then the structures are treated in oxygen plasma (50 watts, 2 pascals of pressure, 40 cm³/min oxygen flow), produced with a device of the Alcatel Company, whereby the substrate is fully laid free on the places of the multilayer coating that are free of the covering layer. Structures (equidistant lines and intermediate spaces) of 0.3 Am may be resolved with vertical wall profiles and without residue on the substrate.

Example 4

A silicon wafer coated analogously to Example 3 is contact-exposed through a chromium-quartz mask (0.5 µm as the smallest mask structures) with radiation of a wavelength of 193 nm, produced with a Lambda-Physics LPF 205 excimer laser. The dose amounts to 26 mJ/cm². After this, it is heated and developed, as in Example 3. The 0.5 µm structures (equidistant lines/intermediate spaces) are imaged with vertical wall profiles.

Example 5

Production of a terpolymer of methacrylic acid tetrahydro-2H-pyranyl ester, methacrylic acid and methacryloxypropyltris(trimethylsiloxy) silane.

A solution of 2.13 g (12.5 mmoles) of methacrylic acid tetrahydro-2H-pyranyl ester, 2.11 g (5 mmoles) of methacryloxypropyltris(trimethylsiloxy)silane, 0.65 g (7.6 mmoles) of methacrylic acid, 0.08 g of azobisisobutyronitrile, and 0.05 g of 1-dodecanethiol in 35 ml of tetrahydrofuran is stirred with a magnetic stirrer in a 100-ml round-bottomed flask for 20 hours under a nitrogen atmosphere at a temperature of 75° C. After cooling the reaction solution, precipitation is produced by the addition of 500 milliliters of water. The formed precipitate is filtered off and dried under high vacuum ($4\times10^{-6}$ bars) whereby 3.0 g (61% of the theoretical) of a white powder are obtained.

GPC (polstyrene calibration standard): $M_w$=13,260; $M_n$=6,290; $M_w/M_n$=2.1.

TGA (heating rate of 10° C./min.): weight loss of 24.1% between 110 and 210° C.

UV Absorption at a 193 nm of a 0.45-µm thick film, produced by spinning a solution of the polymer in cyclopentanone and subsequent one-minute drying at 100° C.:0.17.

Example 6

Production of a terpolymer of methacrylic acid t-butyl ester, methacrylic acid, and methacryloxypropyl-tris (trimethylsiloxy)silane.

A solution of 3.56 g (25 mmoles) of methacrylic acid t-butyl ester, 4.22 g (10 mmoles) of methacryloxypropyl-tris(trimethylsiloxy)silane, 1.29 g (15 mmoles) of methacrylic acid, 0.16 g of azobisisobutyronitrile and 0.1 g of 1-dodecanethiol in 64 ml of tetrahydrofuran is stirred with a magnetic stirrer in a 250-ml round-bottomed flask for 20 hours under a nitrogen atmosphere at a temperature of 75° C. After cooling the reaction solution, it is precipitated by addition of 700 milliliters of water. The formed precipitate is filtered off and dried under high vacuum ($4 \times 10^{-6}$ bars), whereby 8.4 g (93% of the theoretical of a white powder are obtained.

GPC (polstyrene calibration standard): $M_w$=9,460; $M_n$=3,890; $M_w/M_n$=2.4.

TGA (heating rate of 10° C./min.): weight loss of 25.8% between 165 and 280° C.

Example 7

The resist solution of Example 2 is spun at 6,000 rpm onto a 4-inch silicon wafer, which has already been coated with a 0.6-μm thick layer of a novolak film (produced by spinning a solution of a novolak with 28 mole % cresol component (Novolak® P28 of OCG) in cyclopentanone and subsequent 30-minute heating at 250° C. After heating on the hot plate (1 minute; 100° C.), a 0.25-μm thick covering film results. The thus-coated wafer is now exposed in an image-forming manner with a SVGL Micrascan Stepper prototype (installed at MIT Lincoln Laboratories, Lexington, Mass., U.S.A.) with a lens of numerical opening of 0.5 at a wavelength of 193 nm (irradiation dose of 24 mJ/cm$^2$) and then heated for another 1 minute with a hot plate at a temperture of 100° C. After this, it is developed first with a 0.0016 N solution of tetramethylammonium hydroxide in water, whereby mask structures are formed as a relief in the covering layer. After this, the structures are treated in oxygen plasma (50 watts, 2 pascals of pressure, 40 cm$^3$/min oxygen flow), produced by a device of the Alcatel Company, whereby the substrate is fully laid free at the places of the multilayer coating that are free of the covering layer. Structures (equidistant lines and intermediate spaces) of 0.175 μm may be resolved with vertical wall profiles and without residue on the substrate.

Example 8

A resist solution is prepared by dissolving 0.985 g of the terpolymer of Example 6, 10 mg of triphenylsulfonium triflate and 0.5 mg of dimethylaminopyridine in 5 ml of 1-methoxy-2-propyl acetate. This solution is spun at 6,000 rpm onto a 3-inch silicon wafer, which has already been coated with a 0.9-μm thick layer of a novolak film (produced by spinning a solution of a novolak with 28% mole cresol component (Novolak® P28 of OCG) in cyclopentanone and subsequent 30-minute heating at 250° C. After heating on the hot plate (1 minute; 100° C.) a 0.25-μm thick covering film results. The thus-coated wafer is now exposed in an image-forming manner by means of a mercury vapor lamp of the type Ushio UXM-502 MD through a narrow-band interference filter and chromium quartz mask with radiation of a wavelength of 254 nm (irradiation dose of 20 MJ/cm$^2$) and then heated for another 1 minute with a hot plate at a temperature of 100° C. Then, it is developed first with a 0.026 N solution of tetramethylammonium hydroxide in water, whereby the mask structures are imaged as a relief in the covering layer. After this, the structures are treated in oxygen plasma (50 watts, 2 pascals of pressure, 40 cm$^3$/min oxygen flow), produced by a device of the Alcatel Company, whereby the substrate is completely laid free at the places of the multilayer coating free of the covering layer. In this way, submicrometer structures can be resolved with vertical wall profiles and without residue on the substrate.

Example 9

The resist solution from Example 8 is spun at 6,000 rpm onto a 4-inch silicon wafer, which has already been coated with a 0.6-μm thick layer of a novolak film (produced by spinning a solution of a novolak with 28 mole % cresol component (Novolak® P28 of OCG) in cyclopentanone and subsequent 30-minute heating at 250° C. After heating on the hot plate (1 minute; 100° C.), a 0.25-μm thick covering film results. The thus-coated wafer is now exposed in an image-forming manner with a SVGL Micrascan Stepper prototype (installed at MIT Lincoln Laboratories, Lexington, Mass., U.S.A.) with a lens of numerical opening of 0.5 at a wavelength of 193 nm (irradiation dose of 24 mJ/cm$^2$) and then heated for another 1 minute with a hot plate at a temperature of 100° C. After this, it is developed first with a 0.026 N solution of tetramethylammonium hydroxide in water, whereby the mask structures are imaged as a relief in the covering layer. After this, the structures are treated in oxygen plasma (50 watts, 2 pascals of pressure, 40 cm$^3$/min oxygen flow), produced by a device of the Alcatel Company, whereby the substrate is completely laid free on the places of the multilayer coating that are free of the covering layer. Submicrometer structures may be resolved with vertical wall profiles and without residue on the substrate.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A radiation sensitive composition comprising (a) a terpolymer containing 20–70 mole percent of repeating structural units of formula (I) and 3 to 40 mole percent of repeating structural units of the formula (II):

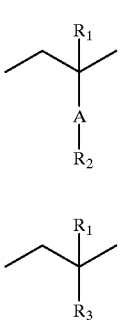

as well as repeating units of formula (III):

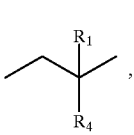

whereby

A indicates a direct single bond or group of the formula:

$R_1$ indicates a hydrogen atom or a methyl group $R_2$ indicates a 2-furanyloxy or 2-pyranyloxy group or a group of the formula:

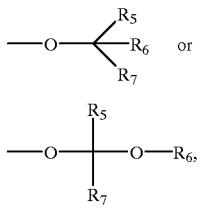

$R_3$ indicates a group of the formulas:

—COOH or —CN, $R_4$ indicates a group selected from the groups of the formula:

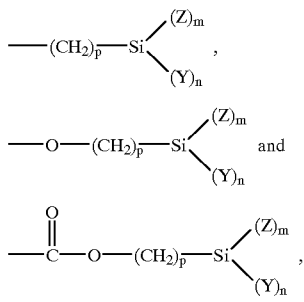

$R_5$ indicates a $C_1$–$C_6$ alkyl group or a phenyl group,
$R_6$ indicates a $C_1$–$C_6$ alkyl group or a phenyl group,
$R_7$ indicates a $C_1$–$C_6$ alkyl group or a phenyl group,
Y indicates a hydrogen or a methyl group,
Z indicates a group of the formula —$OSi(CH_3)_3$,
m indicates 1, 2 or 3, n indicates 3 minus m, and p indicates 0, 1, 2 or 3
and whereby
as many structural units of formula (III) are contained in the terpolymer such that its silicon content amounts to 7–20 weight percent; and (b) a photoinitiator that forms acid under the effect of actinic radiation with a wavelength below 300 nm.

2. The radiation sensitive composition of claim 1 wherein $R_3$ is —COOH.

3. The radiation sensitive composition of claim 1 wherein $R_1$ is methyl.

4. The radiation sensitive composition of claim 1 wherein p equals 1, 2 or 3.

5. The radiation sensitive composition of claim 4 wherein p equals 3.

6. The radiation sensitive composition of claim 1 wherein $R_2$ is selected from the group consisting of:

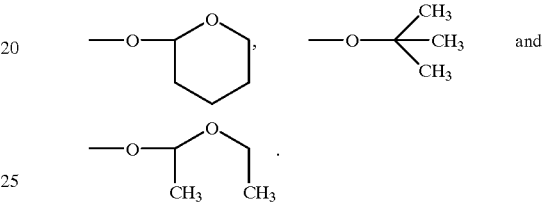

7. The radiation sensitive composition of claim 1 wherein $R_2$ is:

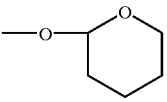

$R_3$ is —COOH; and $R_4$ is —$(CH_2)_3$—$Si[OSi(CH_3)_3]_3$.

8. The radiation sensitive composition of claim 1, containing 3 to 35 mole percent of repeating units of formula (II).

9. The radiation sensitive composition of claim 7, containing 3 to 31 mole percent of repeating structural units of formula (II), 10 to 30 mole percent of repeating structural units of formula (III), and wherein repeating structural units of formula (I) form the balance to 100 mole percent.

* * * * *